(12) United States Patent
Hynecek

(10) Patent No.: US 9,520,425 B2
(45) Date of Patent: *Dec. 13, 2016

(54) IMAGE SENSORS WITH SMALL PIXELS HAVING HIGH WELL CAPACITY

(71) Applicant: Semiconductor Components Industries, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 464 days.

This patent is subject to a terminal disclaimer.

(21) Appl. No.: 14/189,382

(22) Filed: Feb. 25, 2014

(65) Prior Publication Data

US 2014/0246748 A1 Sep. 4, 2014

Related U.S. Application Data

(60) Provisional application No. 61/771,657, filed on Mar. 1, 2013.

(51) Int. Cl.
*H01L 21/00* (2006.01)
*H01L 27/146* (2006.01)

(52) U.S. Cl.
CPC ........ *H01L 27/1461* (2013.01); *H01L 27/1463* (2013.01); *H01L 27/1464* (2013.01); *H01L 27/14612* (2013.01); *H01L 27/14689* (2013.01)

(58) Field of Classification Search
CPC ........................................... H01L 21/00
See application file for complete search history.

(56) References Cited

U.S. PATENT DOCUMENTS

| | | |
|---|---|---|
| 8,247,853 B2 | 8/2012 | Hynecek |
| 8,502,290 B2 | 8/2013 | Mao et al. |
| 2013/0146747 A1 | 6/2013 | Hynecek |

*Primary Examiner* — Marvin Payen
(74) *Attorney, Agent, or Firm* — Treyz Law Group, P.C.; Kendall W. Abbasi

(57) ABSTRACT

An image sensor having small pixels with high charge storage capacity, low dark current, no image lag, and good blooming control may be provided. The high charge storage capacity is achieved by placing a p+ type doped layer under the pixel charge storage region with an opening in it for allowing photo-generated charge carriers to flow from the silicon hulk to the charge storage well located near the surface of the photodiode. A compensating n-type doped implant may be formed in the opening. Image lag is prevented by placing a p– type doped region under the p+ type doped photodiode pinning layer and aligned with the opening. Blooming control is achieved by adjusting the length of the transfer gate in the pixel and thereby adjusting the punch-through potential under the gate.

20 Claims, 3 Drawing Sheets

IMAGE SENSORS WITH SMALL PIXELS HAVING HIGH WELL CAPACITY

This application claims the benefit of provisional patent application No. 61/771,657 filed Mar. 1, 2013, which is hereby incorporated by reference herein in its entirety.

BACKGROUND

This relates to solid-state image sensors and more specifically, to in sensors with small pixels having high well capacity.

Typical image sensors sense light by converting impinging photons into electrons or holes that are integrated (collected) in sensor pixels. After completion of an integration cycle, collected charge is converted into a voltage, which is supplied to the output terminals of the sensor. In complementary metal oxide semiconductor (CMOS) image sensors, the charge to voltage conversion is accomplished directly in the pixels themselves and the analog pixel voltage is transferred to the output terminals through various pixel addressing and scanning schemes. The analog signal can be also converted on-chip to a digital equivalent before reaching the chip output. The pixels have incorporated in them a buffer amplifier, typically a Source Follower (SF), which drives the sense lines that are connected to the pixels by suitable addressing transistors.

After charge to voltage conversion is completed and the resulting signal transferred out from the pixels, the pixels are reset in order to be ready for accumulation of new charge. In pixels that use a Floating Diffusion (FD) as the charge detection node, the reset is accomplished by turning on a reset transistor that conductively connects the FD node to a voltage reference, which is typically the pixel drain node. This step removes collected charge; however, it also generates kTC-reset noise as is well known in the art. This kTC-reset noise is removed from the signal using a Correlated Double Sampling (CDS) signal processing technique in order to achieve the desired low noise performance. CMOS image sensors that utilize a CDS technique usually include three transistors (3T) or four transistors (4T) in the pixel, one of which serves as the charge transferring (Tx) transistor. It is possible to share some of the pixel circuit transistors among several photodiodes, which also reduces the pixel size. An example of a 4T pixel circuit with pinned photodiode can be found in U.S. Pat. No. 5,625,210 to Lee, incorporated herein as a reference.

FIG. 1 is a simplified cross-sectional view of a portion of a typical image sensor pixel 100. As shown in FIG. 1, image sensor pixel 100 includes a pixel photodiode (PD) that collects the photon-generated carriers, a charge transfer gate 110 of a charge transfer transistor, and a floating diffusion 104. The pixel is fabricated in a substrate 101, that has a p+ doped layer 102 deposited on a back surface. The device substrate 101 also includes an epitaxial p-type doped layer 115 situated above the p+ type doped layer 102. The photons that enter this region generate carriers that are collected in the potential well of the photodiode (PD) formed in region 108.

The surface of epitaxial layer 115 is covered by an oxide layer 109 that isolates the doped poly-silicon charge transfer gate Tx 110 from the substrate. A masking cap oxide 111 is deposited on an upper surface of poly-silicon gate 110, which serves as a patterning hard mask as well as an additional blocking mask for the ion implantation that forms the PD charge storage region. The PD is formed by an n-type doped layer 108 and a p+ type doped potential pinning layer 107.

Sidewall spacers 116 are sometimes incorporated to control the mutual edge positions of p+ type doped layer 107 and charge storage layer 108. The FD diode 104 that senses charge transferred from the PD is connected to the pixel source follower SF transistor (not shown). The FD, SF, and the remaining pixel circuit components are all built in the p-type doped well 103 that diverts photon-generated charge into the photodiode potential well located in layer 108. The pixels are isolated from each other by p+ type doped regions 105 and 106, which may extend all the way to the p+ type doped layer 102. The whole pixel is covered by several inter-level (IL) oxide layers 112 (only one is shown in FIG. 1) that are used for pixel metal wiring and interconnect isolation. The pixel active circuit components are connected to the wiring by metal via plugs 114 deposited through contact holes 113.

Pixel well capacity is determined primarily by the capacitance between p+ doped layer 107 and charge storage layer 108. By increasing the doping levels in these layers, it is possible to achieve close-to-abrupt doping profiles in the vertical direction in these layers and approach the maximum electric field intensity permissible in the silicon before breakdown. Some contribution to charge storage capacitance is also obtained from the capacitance between n-type doped layer 108 and pixel p+ type doped separation layers 105 and 106. However, due to ion implantation doping profile straggle in the lateral direction, it is not generally possible to achieve the same abrupt doping profile characteristic in this direction as in the vertical direction. There is also almost no storage well capacity contribution from the capacitance between layer 108 and substrate p-type epitaxial doping region 115.

Image sensors are being fabricated with smaller and smaller pixels, it is not uncommon for pixels to have sub-micron dimensions. When pixel size is reduced, the area of doping layers 108 and 107 is also reduced, which in turn leads to a loss in well capacity. An improvement in storage well capacity in small size pixels is discussed in U.S. Pat. No. 8,247,853 to Hynecek, which is hereby incorporated by reference herein.

It may therefore be desirable to he able to provide image sensor pixels such as small image sensor pixels (e.g., pixels with sub-micron dimensions) with increased storage well capacity.

DETAILED DESCRIPTION

Electronic devices such as digital cameras, computers, cellular telephones, and other electronic devices include image sensors that gather incoming light to capture an image. The image sensors may include arrays of image sensor pixels (sometimes referred to as pixels or image pixels). The image sensor pixels in the image sensors may include photosensitive elements such as photodiodes that convert the incoming light into electric charge. The electric charge may be stored and converted into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the image sensor pixels and readout circuitry for reading out image signals corresponding to the electric charge generated by the photosensitive elements.

Figure 1:
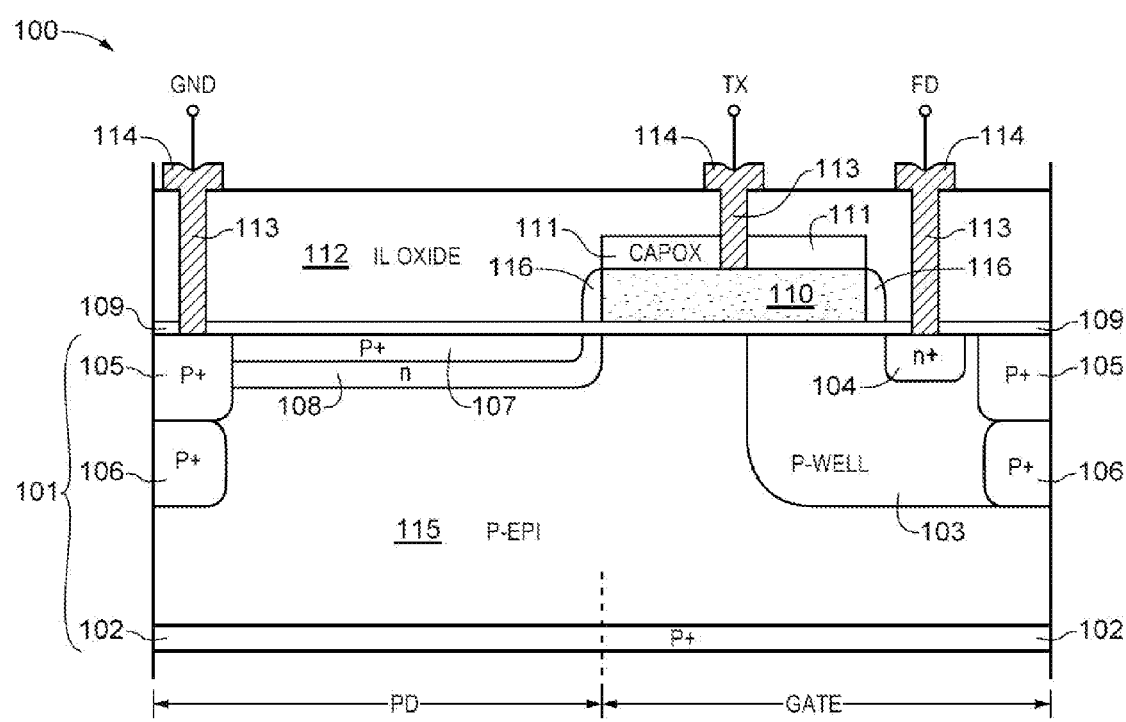
FIG. 1 is a cross-sectional side view of a conventional image sensor pixel.
Figure 2:
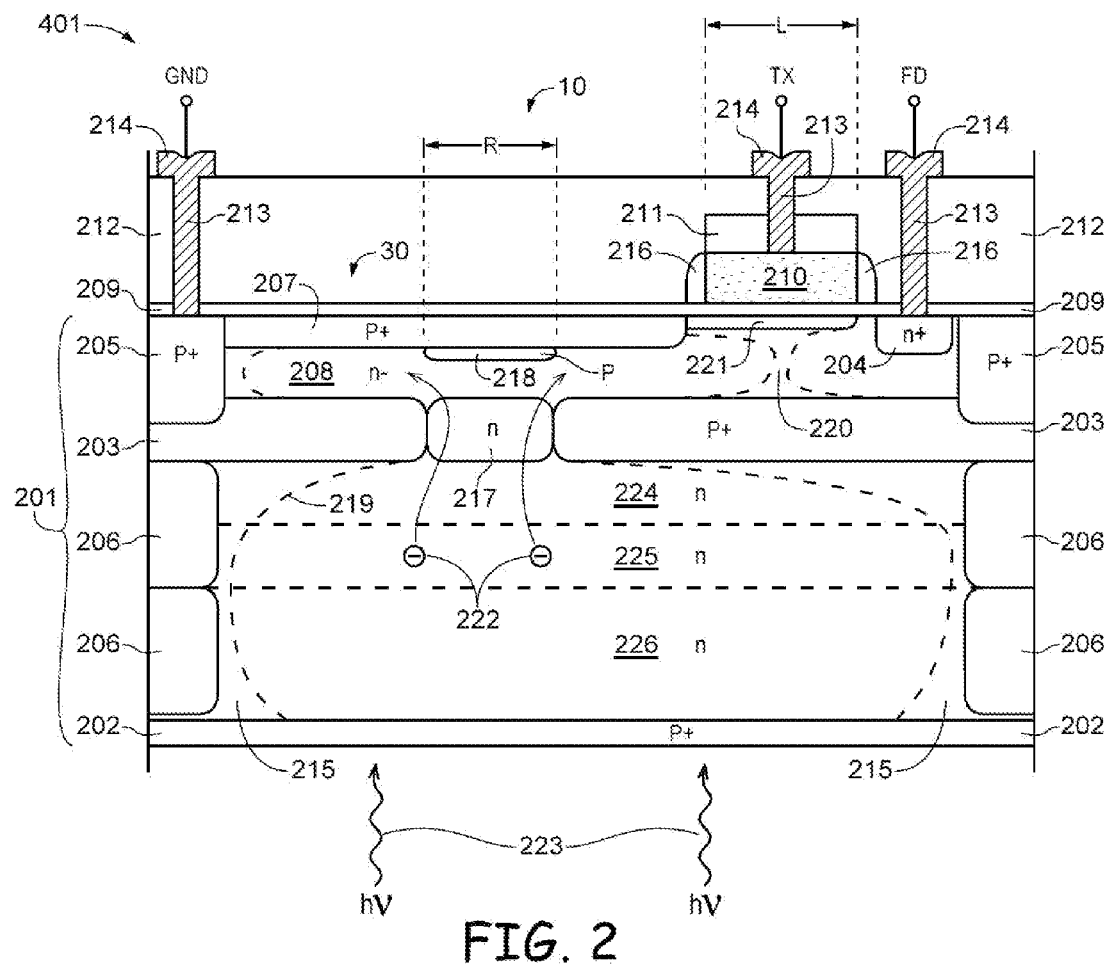
FIG. 2 is a cross-sectional side view of an illustrative image sensor pixel having a p+ doped layer under a photodiode for increased charge storage well capacity in accordance with an embodiment of the present invention.

FIG. 2 is a simplified cross-sectional side view of a portion of an image sensor showing an illustrative image sensor pixel 10 in a pixel array 401. Although only one pixel is shown in FIG. 2, pixel array 401 may include any suitable number of image sensor pixels 10. Each image sensor pixel 10 in pixel array 401 may, if desired, have a configuration of the type shown in FIG. 2. Pixels 10 may, for example, be pixels having sub-micron dimensions.

As shown in FIG. 2, image sensor pixel 10 may include a device substrate such as silicon substrate 201. Substrate 201 may include a p+ type doped layer 202 and an epitaxial p-type doped layer such as p-type epitaxial layer 215 situated above p+ type doped layer 202. Photons 223 that enter this region may generate carriers such as photon-generated carriers 222. Photon-generated carriers 222 may be collected in the potential well of photodiode (PD) 30 formed in region 208. The use of p+ type doped layer 202 may help prevent the generation of excessive dark current by the interface states.

The surface of epitaxial layer 215 may be covered by an oxide layer such as oxide layer 209. Oxide layer 209 may be used to isolate a doped poly-silicon charge transfer gate Tx such as charge transfer gate 210 from substrate 201. A masking cap oxide such as masking cap oxide 211 may be deposited on an upper surface of poly-silicon gate 210, which serves as a patterning hard mask as well as an additional blocking mask for the ion implantation that forms the PD charge storage region. PD 30 is formed by n-type doped layer 208 and p+ type doped potential pinning layer 207, which may help reduce the interface states generated dark current (similarly to p+ type doped layer 202). If desired, spacers such as sidewall spacer structures 216 may be used to control the mutual edge positions of p+ type doped layer 207 and charge storage layer 208. A floating diffusion (FD) diode such as FD diode 204 may be used to sense charge transferred from PD 30 and may be connected to a pixel source follower SF transistor gate (not shown).

Pixels may be isolated from each other by several p-type doped implants such as p-type doped implants 205 and 206, which may extend all the way to p+ type doped layer 202. Image sensor pixel 10 may be covered by several inter-level (IL) oxide layers 212 (only one is shown in FIG. 2). IL oxide layers 212 may be used for interconnect isolation and may include conductive interconnects such as metal pixel wiring. Active circuit components in pixel 10 may be connected to metal wiring in IL oxide layers 212 using conductive material such as metal vias 214 (sometimes referred to as metal plugs). Metal plugs 214 may be deposited in contact via holes in layer 212 such as contact via holes 213.

A p+ layer such as p+ layer 203 may be deposited under some or all of the entire pixel array 401. As shown in FIG. 2, p+ layer 203 is located under photodiodes 30 and extends parallel to the surface of substrate 201 in which photodiodes 30 are formed. For example, p+ layer 203 may be deposited under pixel transistors such as source follower (SF) transistors, row select (RS) transistors, and pixel reset transistors (not shown in FIG. 2). P+ layer 203 may be coupled to ground and may be Used to increase the charge storage capacitance of photodiode 30. An opening such as opening 217 may be formed in p+ layer 203 in order to allow charge carriers 222 (e.g., electrons), which are generated by impinging photons 223, to flow from the silicon hulk into the storage well located in n-doped region 208. Opening 217 may be formed h implanting a compensating n-type doped region in layer 203.

If care is not taken, electrons accumulated in a compensating region may not be able to be transferred to floating diffusion FD, which could potentially cause image lag. To avoid this problem, an additional p-type doped implant region such as p-type doped implant region 218 may be formed near the surface of photodiode 30. If desired, p-type doped implant region 218 may be formed using the same mask that is used for implant 217 in region 203. As shown in FIG. 2, p-type doped implant region 218 is aligned with compensating n-type doped region 217 in layer 203 (e.g., p-type doped implant region 218 and n-type doped region 217 may have the same width R).

All of the charge generated in the bulk of silicon epitaxial layer 215 may therefore be directed to flow to a single storage region 208. The potential gradient for this electron flow is created by additional n-type implants 224, 225, and 226 in silicon bulk 215. This results in the formation of a large pixel depletion region under the whole pixel, as indicated by depletion region boundary 219. The large depleted region under the image sensor pixel may help reduce pixel crosstalk.

Blooming control in pixel 10 may be achieved by determining an optimum length L of Tx gate 210. Depletion region boundary 219 may extend significantly under Tx gate 210. As shown in FIG. 2, the depletion region from FD 204 may also extend under Tx gate 210. This reduces the electrical effective gate length of Tx gate 210 and increases the potential in punch-through region 220, which may occur despite the accumulation of holes in region 221 that prevents the generation of dark current by interface states. Pixel blooming may be prevented by controlling the potential in punch-through region 220 and by adjusting the potential to a suitable level by adjusting length L of Tx gate 210. For example, pixel overflow charge may flow to floating diffusion FD and through the reset transistor out to the pixel drain instead of flowing to neighboring pixels. Forming a blooming control structure at least partially, from punch-through region 220 may allow the transfer gate to remain biased at its lowest biasing level, thus maintaining the accumulated holes under the transfer gate and minimizing dark current generation.

It is thus possible to control blooming separately for each pixel by selecting different gate lengths for each pixel (e.g., length L may be different for different pixels in the image sensor). For example, the length L of transfer gate Tx 210 may be determined based on an expected light intensity overload. This is important when pixels have color filters deposited on them and reach different overflow levels for a given illumination scenario.

The example of FIG. 2 in which image sensor pixel 10 is a backside illuminated image sensor pixel is merely illustrative. If desired, image sensor pixel 10 may be a front side illuminated image sensor. The pixel array in which pixel 10 is formed may be provided with a color filter array. In backside illuminated image sensors, the color filters may be deposited on the backside of the silicon substrate. In front side illuminated image sensors, the color filters may be deposited on the front side of the silicon substrate. A microlens array may be deposited over the color filter array to improve quantum efficiency and reduce pixel crosstalk.

Figure 3:
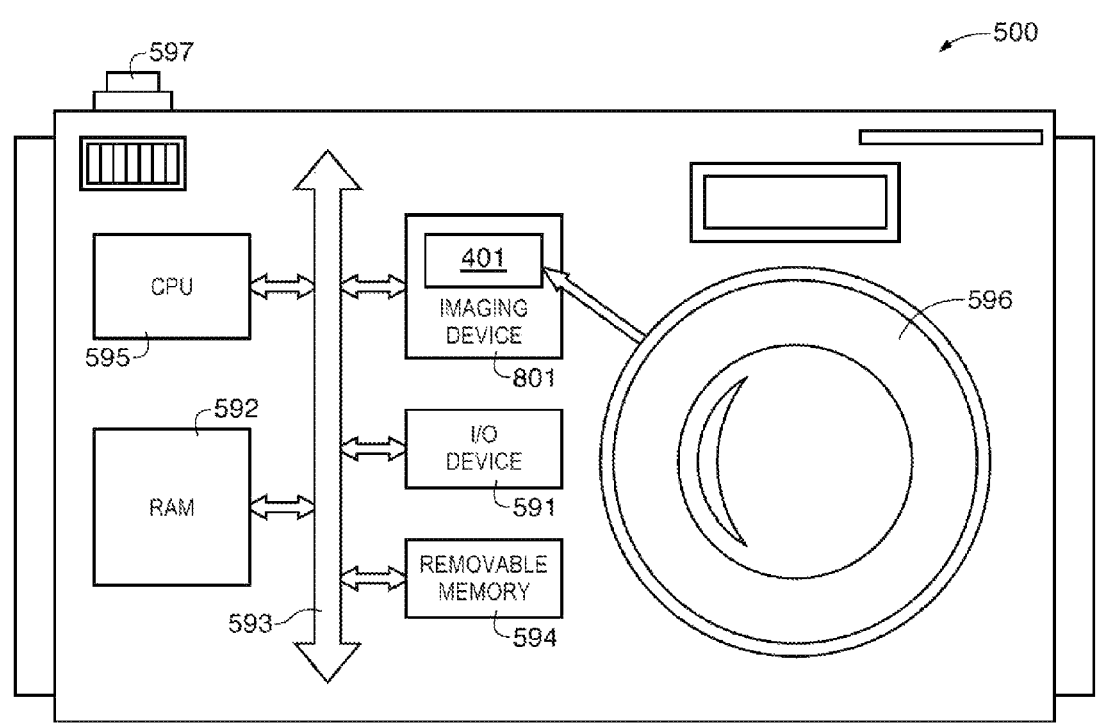
FIG. 3 is a block diagram of a system employing the embodiments of FIG. 2 in accordance with an embodiment of the present invention.

FIG. 3 shows in simplified form a typical processor system 500, such as a digital camera, which includes an imaging device 801. Imaging device 801 may include a pixel array 401 having pixels 10 of the type shown in FIG. 2 formed on an image sensor SOC. Processor system 500 is exemplary of a system having digital circuits that may include imaging device 801. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens such as lens 596 for focusing an image onto a pixel array such as pixel array 401 when shutter release button 597 is pressed. Processor system 500 may include a central processing unit such as central processing unit (CPU) 595, CPU 595 may be a microprocessor that controls camera functions and one or more image flow functions and communicates with one or more input/output (I/O) devices 591 over a bus such as bus 593. Imaging device 801 may also communicate with CPU 595 over bus 593. System 500 may include random access memory (RAM) 592 and removable memory 594. Removable memory 594 may include flash memory that communicates with CPU 595 over bus 593. Imaging device 801 may be combined with CPU 595 with or without memory storage, on a single integrated circuit or on a different chip. Although bus 593 is illustrated as a single bus, it may be one or more buses or bridges or other communication paths used to interconnect the system components.

Various embodiments have been described illustrating small image sensor pixels with high well capacity. This is accomplished by incorporating a special p+ doped layer under the PD with an opening for photo-generated carriers to flow from the silicon bulk to the PD storage region. Blooming control is provided by removing overflow charge through the punch-through region under the Tx gate while the transfer gate remains biased at its lowest biasing level, thus maintaining the accumulated holes under the transfer gate and minimizing dark current.

The foregoing embodiments are intended to be illustrative and not limiting: it is noted that persons skilled in the art can make modifications and variations in light of the above teachings. It is therefore to be understood that changes may be made in the particular embodiments of the invention disclosed, which are within the scope and spirit of the invention as defined by the appended claims. The foregoing is merely illustrative of the principles of this in which can be practiced in other embodiments.

What is claimed is:

1. An image sensor pixel in a pixel array having a silicon substrate, comprising:
   a photodiode formed in a surface of the silicon substrate, wherein the silicon substrate includes a bulk portion under the photodiode;
   a p+ type doped layer that extends under the photodiode parallel to the surface, wherein the p+ type doped layer comprises an opening through which charge carriers pass from the bulk portion of the silicon substrate to the photodiode; and
   a compensating n-type doped implant region in the opening.

2. The image sensor pixel defined in claim 1 further comprising a p-type doped implant region interposed between the photodiode and the compensating n-type doped implant region, wherein the p-type doped implant region is aligned with the compensating n-type doped implant region.

3. The image sensor pixel defined in claim 2 wherein the p-type doped layer is connected to ground.

4. The image sensor pixel defined in claim 2 further comprising:
   a transfer gate formed on the surface of the silicon substrate;
   a punch-through region under the transfer gate; and
   a blooming control structure formed at least partially from the punch-through region under the transfer gate.

5. The image sensor pixel defined in claim 4 wherein the transfer gate has a length and wherein a pixel blooming level is determined based on the length of the transfer gate.

6. The image sensor pixel defined in claim 5 wherein the length of the transfer gate of the image sensor pixel is different than that of transfer gates of other image sensor pixels in the pixel array.

7. The image sensor pixel defined in claim 5 wherein the length of the transfer gate is determined based on an expected light intensity overload.

8. The image sensor pixel defined in claim 2 further comprising a plurality of n-type doped regions formed in the bulk portion of the silicon substrate, wherein the plurality of n-type doped regions form a potential gradient that directs charge carriers from the bulk portion of the silicon substrate through the opening.

9. The image sensor pixel defined in claim 2 further comprising a plurality of pixel separation implants that separate the image sensor pixel from other image sensor pixels in the pixel array.

10. The image sensor pixel defined in claim 1 wherein the image sensor pixel is a backside illuminated image sensor pixel.

11. An image sensor having an array of image sensor pixels and a silicon substrate, the image sensor comprising:
    a plurality of photodiodes formed in a surface of the silicon substrate, wherein the silicon substrate includes a bulk portion under the plurality of photodiodes;
    a p+ type doped layer that extends under the plurality of photodiodes parallel to the surface, wherein the p+ type doped layer comprises a plurality of openings through which charge carriers pass from the bulk portion of the silicon substrate he photodiodes; and
    a plurality of compensating n-type doped implant regions, wherein each compensating n-type doped implant region is formed in a respective one of the openings.

12. The image sensor defined in claim 11 further comprising a plurality of p-type doped implant regions, wherein each p-type doped implant region is interposed between a respective one of the photodiodes and a respective one of the compensating n-type doped implant regions, wherein each p-type doped implant region is aligned with the respective compensating n-type doped implant region.

13. The image sensor defined in claim 12 wherein the p-type doped layer is connected to ground.

14. The image sensor defined in claim 12 further comprising
    a plurality of transfer gates formed on the surface of the silicon substrate;
    a punch-through region under each transfer gate; and a plurality of blooming control structures, wherein each blooming control structure is formed at least partially from the punch-through region under a respective one of the transfer gates.

15. A system, comprising:
a central processing unit;
memory;
input-output circuitry; and
an image sensor pixel in a pixel array having a silicon substrate, comprising:
  a photodiode thrilled in a surface of the silicon substrate, wherein the silicon substrate includes a bulk portion under the photodiode;
  a p+ type doped layer that extends under the photodiode parallel to the surface, wherein the p+ type doped layer comprises an opening through which charge carriers pass from the bulk portion of the silicon substrate to the photodiode; and
  a compensating n-type doped implant region in the opening.

16. The system defined in claim 15 further comprising a p-type doped implant region interposed between the photodiode and the compensating n-type doped implant region, wherein the p-type doped implant region is aligned with the compensating n-type doped implant region.

17. The system defined in claim 16 wherein the p-type doped layer is connected to around.

18. The system defined in claim 16 further comprising:
  a transfer gate formed on the surface of the silicon substrate;
  a punch-through region under the transfer gate; and
  a blooming control structure formed at least partially from the punch-through region under the transfer gate.

19. The system defined in claim 18 wherein the transfer gate has a length and wherein a pixel blooming level is determined based on the length of the transfer gate.

20. The image sensor pixel defined in claim 19 wherein the length of the transfer gate of the image sensor pixel is different than that of transfer gates of other image sensor pixels in the pixel array.

* * * * *